United States Patent
Srinivasan et al.

(10) Patent No.: US 8,332,539 B2
(45) Date of Patent: Dec. 11, 2012

(54) BINARY DATA SERIALIZATION SYSTEM USING MACHINE DEPENDANT DATA ALIGNMENT

(76) Inventors: Sudharshan Srinivasan, Fremont, CA (US); Jai Kumar, Cupertino, CA (US); Kothandraman Ramchandran, Fremont, CA (US)

( * ) Notice: Subject to any disclaimer, the term of this patent is extended or adjusted under 35 U.S.C. 154(b) by 453 days.

(21) Appl. No.: 12/799,407

(22) Filed: Apr. 24, 2010

(65) Prior Publication Data

US 2011/0264819 A1    Oct. 27, 2011

(51) Int. Cl.
*G06F 15/16*    (2006.01)
(52) U.S. Cl. ........................................ 709/246
(58) Field of Classification Search .................. 709/246
See application file for complete search history.

(56) References Cited

U.S. PATENT DOCUMENTS

| | | | |
|---|---|---|---|
| 2004/0030856 A1* | 2/2004 | Qureshi et al. | 711/202 |
| 2004/0221274 A1* | 11/2004 | Bross et al. | 717/136 |
| 2004/0221276 A1* | 11/2004 | Raj | 717/136 |
| 2011/0154303 A1* | 6/2011 | Rice et al. | 717/140 |

* cited by examiner

*Primary Examiner* — Larry Donaghue

(57) ABSTRACT

A binary data transfer system is described to transfer data from data source (31) to data destination (32). The system partitions placement and type data from binary data to be transferred as independent data streams and retains binary format of data source (31) including type information, padding information and endian information for the network transfer. This eliminates data parsing overheads at a data source (31) and reduces data parsing overheads required at a data destination (32). In this system, data destination (32) decodes transferred binary data using software code (47) transferred from data source (31). This transferred software code (47) optionally decodes base sixty four encoding and uses the type information, padding information and endian information to extract data from binary data stream at data destination (32).

This system is applicable to any binary data transfer system between any data source and destination like a web browser client that accesses a server on the web. Hence combining native data format of a data source (31) along with transfer of software code to decode and encode such data at data destination (32), eliminates processing overheads at server and reduces processing overheads at client.

16 Claims, 5 Drawing Sheets

BINARY DATA SERIALIZATION SYSTEM USING MACHINE DEPENDANT DATA ALIGNMENT

CROSS-REFERENCE TO RELATED APPLICATIONS

Not applicable

FEDERALLY SPONSORED RESEARCH

Not applicable

SEQUENCE LISTING OR PROGRAM

Not applicable

BACKGROUND OF THE INVENTION

1. Field of Invention

The present invention generally relates to data serialization systems to transfer data across computer processes and specifically to data serializations systems that use native data format of a data source to eliminate parsing and alignment overheads.

Data transfer systems across computer processes or programs transfer data in textual or binary formats. Such transfer can be for independent data units or related data units. If related data units are transferred then data is first serialized so that dependency between data units can be maintained. Data serialization is a process by which interdependent data units are placed one after the other so that a set of units can be transferred across computer systems and dependency graph or tree can be reconstructed after the transfer.

Data serialization is usually used in binary data transfer systems. There are several binary data transfer systems in prior art, but all of the known systems of prior art first convert the binary data into a common data format that can be accessed across several computer systems. Data formats specify how data is organized in memory of a computer process. This organization is controlled by the compiler and the processor of a computer system. Specifically, data organization can differ in memory alignment of data structures, and endianness of primitive data types. For example in a little endian system, the high order byte of a four byte data is at the end of the four byte stream, whereas in big endian systems this order is reversed. Also, memory alignment between different compilers can vary. Compilers introduce padding bytes in between data structure elements. This improves data access speeds, but these are non standard across compilers.

Hence exchange of binary data between different processes running on different computer systems that may be executing different computer languages is a challenging task.

Thus most prior art systems recommend an approach where binary data from a data source is first converted into a common format, and then transferred, so that destination processes can convert binary data from the common format to required native data format of data destination.

This approach saves the effort of writing converters for each of the destinations from each of the sources. But such systems introduce an additional level of processing on both the data source and data receiver. This can get quite expensive when a data source is a server that is accessed millions of times by data receivers. In particular, such a server could be a web server and the data receiver could be a mobile device with a web browser.

A web server usually has to process several thousand requests concurrently and transforming binary data to a common data format for each request can be expensive and consume a lot of processing power that degrades system performance severely.

Similarly, if a mobile device that receives binary data, has to convert from a common data format to a native data format, then there is additional processing required. This will decrease the amount of time a mobile device can be used, as additional processing will consume more battery power.

In the case where both data source and data destination are mobile devices, this problem is compounded. This can occur in cases where a data source is an accessory device to a main mobile device. In this case an accessory acts as a server and it has to do minimal processing of data that is to be serialized, and the client device that is also a mobile device needs to perform minimum processing to use the data received.

Hence it can be seen that there is a need to reduce the amount of processing that has to be done either at the source of data or destination of data or at both places, while transferring binary data that may need to be serialized.

Such a system can only be implemented if data format along with a data source compatible data access software program is communicated from a data source to data destination, thus enabling the data source to send out data without conversion and receive incoming data from data destination in its own data format.

Such a system is not known to exist in prior art.

Following paragraphs in current section describe relevant prior arts in this field.

Prior art US Doc 20080163269 proposes a remote procedure calling system that offers selective decoding of output parameters of a response from a server in a client program to defer decoding logic until data is used at a client. But this system still uses an intermediate format to pass data between client and server that is created using a interface definition language. Referring to FIG. 17 of this prior art document, it is clear that the request message contains information about actual request data and the corresponding byte sequence. Similarly referring to FIG. 19 of this prior art document, it is clear that the byte sequence of each of the data types is carried in each response message.

Hence it can be seen that although this system offers selective decoding of message contents, this system still uses intermediate format for both request and responses. This system only postpones the decoding to a point when access to certain data is needed, but does not eliminate the decoding and encoding process in either the server or the client. Hence if a client needs to access all data units, then the client would have to decode all data units. Similarly if a server needs to use all data in an input message, then it has to decode all the data units from the intermediate format that specifies the byte sequence and the type of data along with the data itself. Hence it is clear that this system cannot eliminate data decoding but merely postpones the processing to a later stage.

In order for a system to provide reduced processing while transferring data, the processing should be reduced in client or server or both, and it should be applicable all the time and not in selective time periods. Hence it is clear that this system does not address the need to transfer serialized binary data in the native data format of a data source to reduce usage of computing resources.

Prior art US Doc 20020120793 proposes a remote procedure calling system where a proxy object is automatically generated at a client based on the request profile. But this system does not address the need to transfer serialized binary data in the native data format of a data source to reduce usage of computing resources.

Prior art US Doc 20020107890 proposes a system to make a remote procedure call from a client to a server using a script that is uploaded into the server which then executes that code and returns the results. This system tries to avoid native code download into a browser as a plugin and uses a script that is to be executed at the server. But this system does not address the need to transfer serialized binary data in the native data format of a data source to reduce usage of computing resources.

Prior art US Doc 20050071809 proposes a system to dynamically map a type of data to appropriate serialization agent based on a type mapping system. Although this system enables dynamic mapping of data to corresponding data serialization function, this system does not address the need to transfer serialized binary data in the native data format of a data source to reduce usage of computing resources.

Prior art US Doc 20040268242 proposes a system to map data structures to a extensible markup language (XML) encoding format with duplicate data encoded as references to reduce the amount of data transferred. But XML is a text based transfer format and does not address the needs of a binary transfer protocol. Hence this system does not address the need to transfer serialized binary data in the native data format of a data source to reduce usage of computing resources.

Prior art U.S. Pat. No. 7,150,004 describes a system where data mapping for serialization is done automatically hence enabling serialization and deserialization to adapt to incompatibilities. But this does not address the need to reduce amount of processing that will be needed for data conversion at data source and data destination. This only addresses automatic format creation based on data source and destination.

As can be seen from above, all known prior arts suffer from some limitations in offering a solution to address the need for a data serialization system that enables data transfer from a data source to data destination with no conversion needed at a data source to save on computing resources.

OBJECTS AND ADVANTAGES

Accordingly, several objects and advantages of the present invention are:

a) to provide a data serialization system that completely eliminates data parsing, encoding and decoding of data at a server in a client server data communication system;
b) to provide a data serialization system that does not mandate a intermediate format that is common across client and servers;
c) to provide a data serialization system that uses the servers native data format as the transfer format to and from the server, thus eliminating any data conversions at the server;
d) to provide a data serialization system that reduces computational resource at client for decoding and encoding data that is to be communicated to the server, although not eliminating such overheads completely; and
e) to provide a data serialization system that enables client software to be upgraded automatically for decoding and encoding data to be communicated with server if there is a change in data formats in server.

SUMMARY

In accordance with present invention a binary data serialization system is described that eliminates decoding and encoding overheads at a data source and reduces computing overheads required at a data destination although not eliminating the overheads completely at data destination. This system is well suited to a client server data transfer system. Hence a client server system is used as an example below. But this system is equally applicable to any binary data transfer system between any data source and a data destination.

This is achieved by transferring binary data from a server to a client in data format that is native to the server along with software code to be executed at the client that enables encoding and decoding of server data in a client.

Transferring software code that enables encoding and decoding server native data format in a client is particularly useful in client server software such as a web browser and web server where a web browser runs a software interpreter.

To illustrate how transferring data in binary data format of server and corresponding code to access such data enables performance benefits, the process of data transfer from server to client and client to server is described below.

When data needs to be transferred from a server to a client, data format used is native data format of the server and if data serialization is required, data from the server that may be organized as a tree or graph is serialized keeping the base format of individual units of data structures intact. This allows a single memory copy of all data required to be transferred to network stream, instead of converting such data and corresponding tree structure into another intermediate data format at the server, thus eliminating any processing overheads required for data encoding at the server.

At the client, data is converted from server native data format to client native data format. But the processing required is reduced by passing in the above mentioned software code information about data alignment and offsets of each of the data types. This eliminates the need to carry data type and placement information in each data stream, hence the corresponding code needed to parse this information is eliminated.

Thus the amount of processing required at the client is reduced substantially while receiving data at the client.

Similarly while sending data from a client to server, the client does not have to describe placement and type of data in the data stream, but just has to encode data into a network stream by using the downloaded software code from server in the native format of the server. This software code will align the data and encode to appropriate endian format, and setup appropriate dependency graph that is in the native data format of the server. This enables the server to execute just one memory copy to recreate an entire tree of data as compared with several memory scans, and allocations that are required by systems of prior art.

This system is well suited for a web browser client that can download code from a web server using javascript language. But this system of transferring binary data into javascript code was not needed for web pages in the past few years as most of web pages were created at the server and transferred to a browser using text based protocol referred to as hyper text transfer protocol (HTTP). But with advent of new web standards that allow for asynchronous javascript code execution (AJAX), rich user interfaces can now be created at the web browser.

But rich user interfaces require a lot of data to be transferred to the web browser and if such data were in text format, this would result in increased parsing overhead at the browser. Hence using a binary protocol to transfer information into a javascript engine produces much more efficient code thus reducing processing requirements which are imperative for mobile devices.

Hence it can be seen that combining a native data format of a server along with software code transfer to decode and encode such data at the client, provides an unobvious result of reducing processing overheads at both server and client, and these benefits are compounded if both server and client are mobile devices.

DRAWINGS

Figures

REFERENCE NUMERALS

Figure 1:
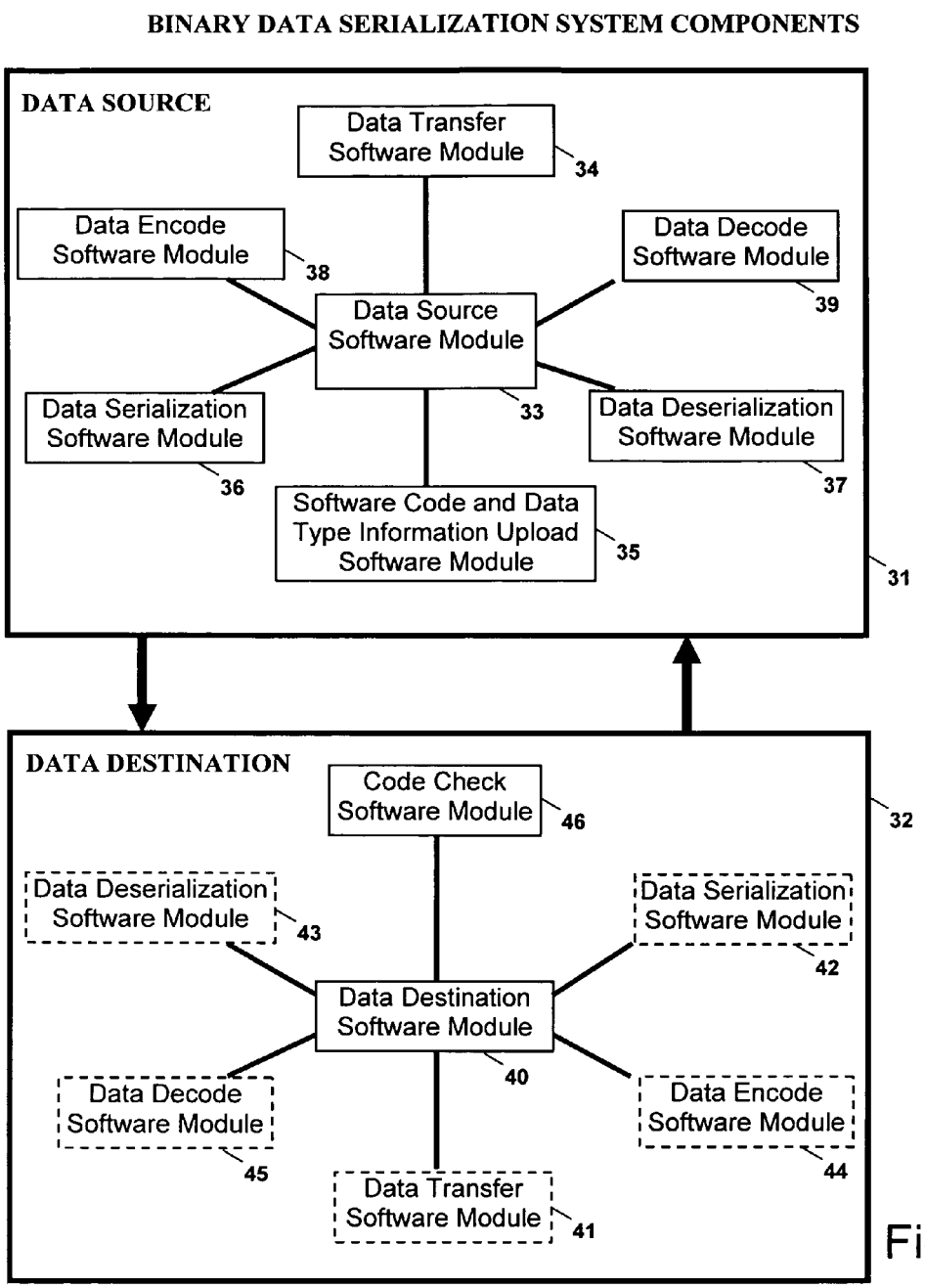
FIG. 1 shows details of a system to transfer binary data from data source to data destination.

31 data source
32 data destination
33 data source software module
34 data transfer software module at data source
35 software code and data type information upload software module
36 data serialization software module at data source
37 data deserialization software module at data source
38 data encode software module at data source
39 data decode software module at data source
40 data destination software module
41 data transfer software module at data destination
42 data serialization software module at data destination
43 data deserialization software module at data destination
44 data encode software module at data destination
45 data decode software module at data destination
46 code check software module
47 transferred software code
48 byte
49 short
50 long
51 data structure with four byte alignment
52 data type information
53 parent data structure one
54 parent data structure two
55 child data structure two
56 parent data structure three
57 child data structure three
58 step
59 step
60 step
61 step
62 step
63 step
64 step
65 step
66 step
67 step
68 step

DETAILED DESCRIPTION OF PREFERRED EMBODIMENT

In the following description, a system to transfer binary data in native format from a data source to a data destination is described followed by details of components of data source and data destination. As an example, binary data transfer is illustrated below between a process executing standard C language program and a process executing standard Javascript program. Then a call flow illustrating the method for transferring data from source to destination and method to transfer data from destination to source using native format of source is shown.

FIG. 1 shows details of a system to transfer binary data from data source 31 to data destination 32. Example of data source 31 can be a data server such as a web server, and example of data destination 32 can be a data client such as a web browser in a client server system.

Data source 31 includes data source software module 33 that is associated with data transfer software module at data source 34, software code and data type information upload software module 35, data serialization software module at data source 36, data deserialization software module at data source 37, data encode software module at data source 38, and data decode software module at data source 39.

Data destination 32 includes data destination software module 40 that is associated with data transfer software module at data destination 41, data serialization software module at data destination 42, data deserialization software module at data destination 43, data encode software module at data destination 44, data decode software module at data destination 45, and code check software module 46. It is to be noted that some of the software modules at data destination 43 described above including data serialization software module 42, data deserialization software module 43, data encode software module 44, and data decode software module 45 are transferred as part of transferred software code 47 from data source 31.

Software code and data type information upload software module 35 is used to send software code and data type information to data destination 32 from data source 31. Software code consists of modules to encode, decode, serialize and deserialized data. Data type information refers to information about a data structure that includes data types or sizes of each of the fields in the data structure along with data offset information, and endian information.

Data transfer software module at data source 34 facilitates the placement of binary data into a network data stream that transfers binary data from data source 31 to data destination 32. Since the binary data is in the native format of data source 31, data transfer software module 34 has to issue a single memory copy operation to send a data structure from 31 to 32 instead of expensive memory alignments, paddings and insertion of placement descriptors as prescribed in methods of prior art. If several data structures have to be transferred, then data serialization would have to be performed at 31 but this overhead can also be reduced by using software techniques that enable creation of multiple data units in a serialized form.

Data serialization software module at data source 36 enables serialization of data structures that are positioned as discontiguous elements in memory. This enables such serialized data to be transferred across a network. For binary data structures that are created in serialized form as mentioned above, this module is not utilized.

Data deserialization software module at data source 37 enables deserialization of data structures into memory that are in a sequence as retrieved from the network stream. For binary data structures that do not have a hierarchical representation in the data sequence, this module is not utilized.

Data encode software module at data source 38 enables encoding of binary data to base sixty four format that enables transfer of binary data through a text based protocol channel such as hyper text transfer protocol. This module is optional and is necessary only in the case where the data transfer channel is a text based protocol channel.

Data decode software module at data source 39 enables decoding of binary data from base sixty four format into native binary data format of data source 31. This module is also optional and is necessary only in the case where the data transfer channel is a text based protocol channel.

Most modules at data destination provide the same functionality as modules in data source as described above. These modules include data serialization software module at destination 42, data deserialization software module at destination 43, data encode software module at destination 44, and data decode software module at destination 45. Additionally, code check software module at destination 46 is used to check if the software code 47 at data destination 44 is in sync with the software code 47 at data source 31.

Figure 2:
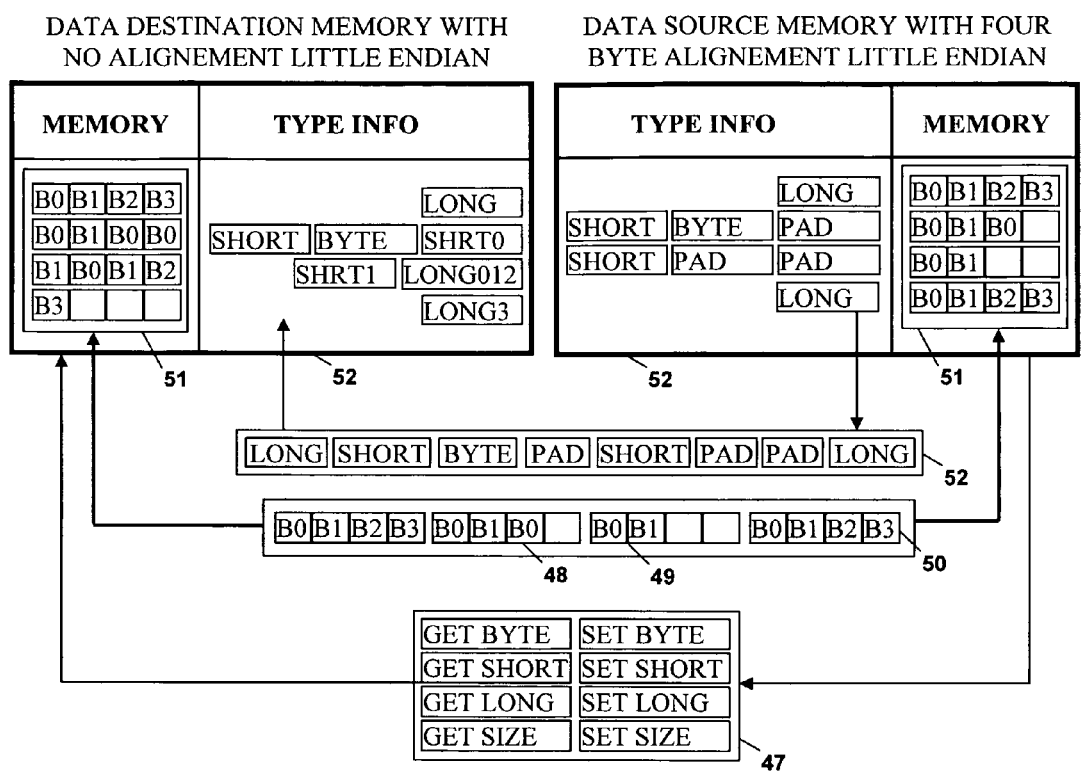
FIG. 2 shows transfer of binary data from data source to data destination.

FIG. 2 shows transfer of binary data from data source 31 to data destination 32. Here the data source is represented as a C language program and data destination is represented as a javascript language program. The figure illustrates transfer of data relating to a byte 48, a short 49 as two bytes, and a long 50 as basic data types. Byte 48 represents eight bits, short 49 represents two bytes, and long 50 represents four bytes. At data source 31, C language data structures are aligned and padded in native endian format. C language data structures can be in units that are already serialized or as discoutiguous units that need to be serialized. Data alignment in C data structures is dependent on the largest field size in that structure. For example, if the largest field size of a data structure is four bytes, then the whole structure is aligned in four byte units. But if largest field size is two bytes, then the whole structure is aligned in two byte units. Hence appropriate number of pad bytes for each field is determined by alignment unit corresponding to the structure. In a four byte aligned structure, a byte field can have three pad bytes, short field can have two pad bytes and long field will have no pad bytes. Such a data structure with four byte alignment 51 is shown in this figure.

Either at request made by data destination or as a spontaneously generated event from data source, data is transferred from data source 31 to data destination 32 as follows.

First data type information 52 and software code 47 such as javascript code is sent from data source 31 to data destination 32 using the source software code and data type information upload software module 35. Then binary data in data structure 51 is copied from memory into network stream as a sequence of bytes preserving data alignment and padding. This initiates binary data transfer in source data format for systems that do not need serialization or encoding of data. In the case where serialization is necessary such as when transferring data structures that are discontiguous, data serialization would have to be performed. Additionally in the case where binary data is to transferred using a text based protocol channel, base sixty four encoding is also done. Such a system is described in the next figure.

At data destination 32, data type information 52 and software code 47 are received. In the case where software code 47 is javascript code and data destination 32 is a web browser, javascript interpreter is used at data destination 32 to execute software code 47. The enables data destination 32 to deserialize and decode binary data from data source 31. It is to be noted that data structures at data destination 32 need not have same data alignment and endianness as the data source. But since data type information is exchanged is not part of binary data stream, such type information need not be scanned for every data stream as compared with systems of prior art, hence substantially reducing processing required to access transferred binary data at data destination 32.

In case of reverse flow, data from data destination 32 is transferred to data source 31 in native format of data source 31.

First, data in data destination 32 is scanned from memory of data destination 32 and software code 47 is used to create corresponding data structures in native data format of data source 31. This involves copying data from memory of data destination 32 into a stream of bytes with appropriate padding and endianness as described as part of transferred software code 47. If multiple discontiguous structures at data destination 32 are to be transferred, then data deserialization software module at data destination 43 that is also part of transferred code software code 47 is used to serialize data. Additionally, if network transfer protocol is text based, serialized data from data destination 32 is encoded into base sixty four format before transferring into network stream.

This data from data destination 32, when received at data source 31 is optionally decoded from base sixty four format into binary data that is directly copied into memory of data source and can be used by corresponding applications. Deserialization of data at data source 31 is optional.

Hence it can be seen that using native data format of data source 31 to transfer binary data from data destination 32 to data source 31 eliminates scanning for data type information, placement information, endian information and reconstruction processing at data source 31 thus resulting in significant reduction in processing binary data at data source 31. In the case where data source 31 is a web server which might be serving thousands of concurrent connections, the benefits of reduced processing are exponentially. Additionally, if data source 31 is a mobile device such as an accessory device that executes an embedded web server, the reduced processing increases the power efficiency of the mobile device significantly leading to longer usage times.

Before any data transfer from data source 31 to data destination 32 occurs, code check module 46 performs a query to data source 31 to verify if new version of transferred code software code 47 needs to be transferred.

Figure 3:
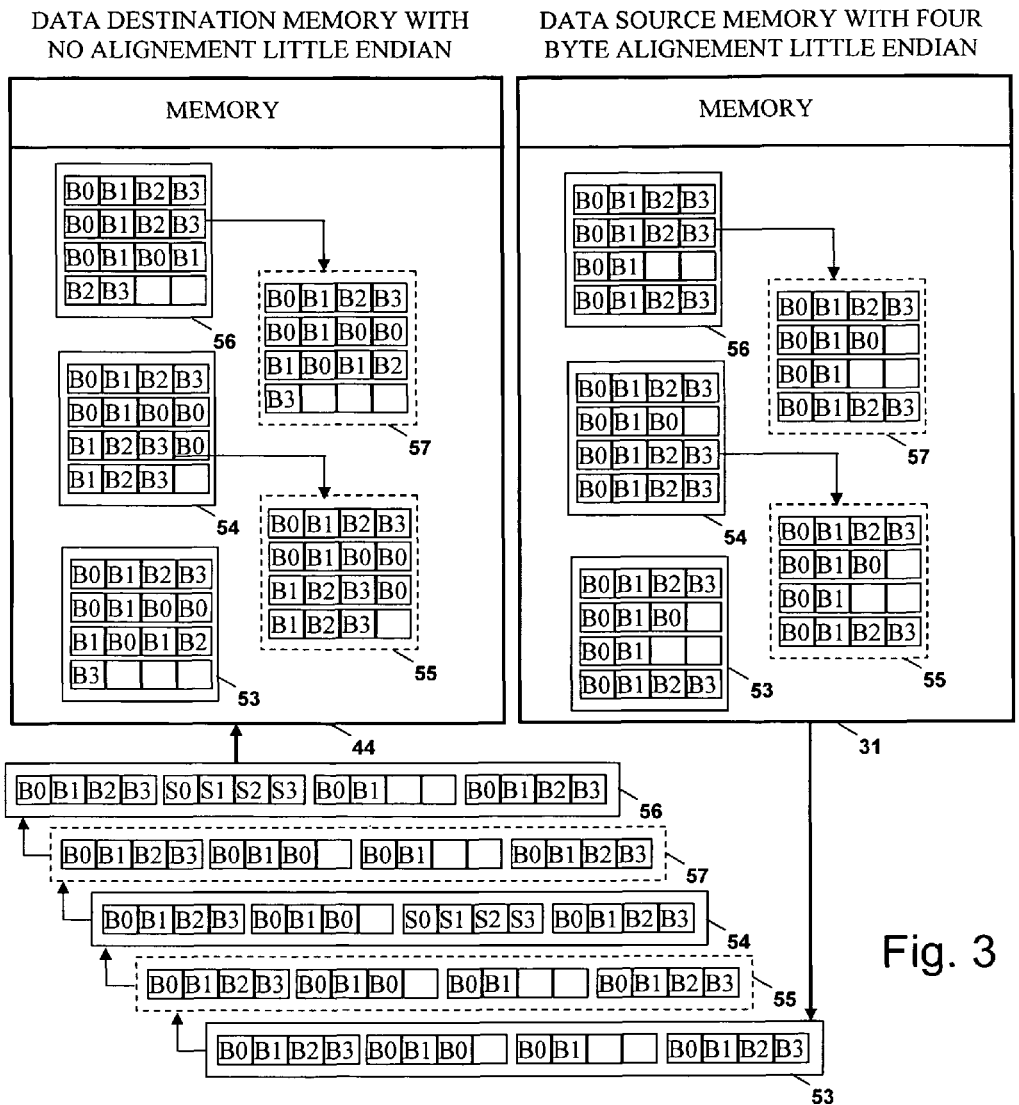
FIG. 3 shows binary data transfer of a C language tree data structure from data source to data destination.

FIG. 3 shows binary data transfer of a C language tree data structure from data source 31 to data destination 44. As an illustration, tree at data source 31 consists of parent data structures that point to children data structures. Of the three parent data structures, parent data structure one 53 does not point to any children while parent data structure two 54 points to child data structure two 55 and parent data structure three 56 points to child data structure three 57. This tree data structure is serialized by data serialization software module at data source 36 into a sequence of bytes with pointers being replaced by sizes of individual data structures that include parent and children data structures before sending into network stream.

As described in description section of FIG. 2, data encoding may be optionally performed if transfer protocol is text based and the reverse flow of binary data from data destination 44 to data source 31 is similarly performed.

Figure 4:
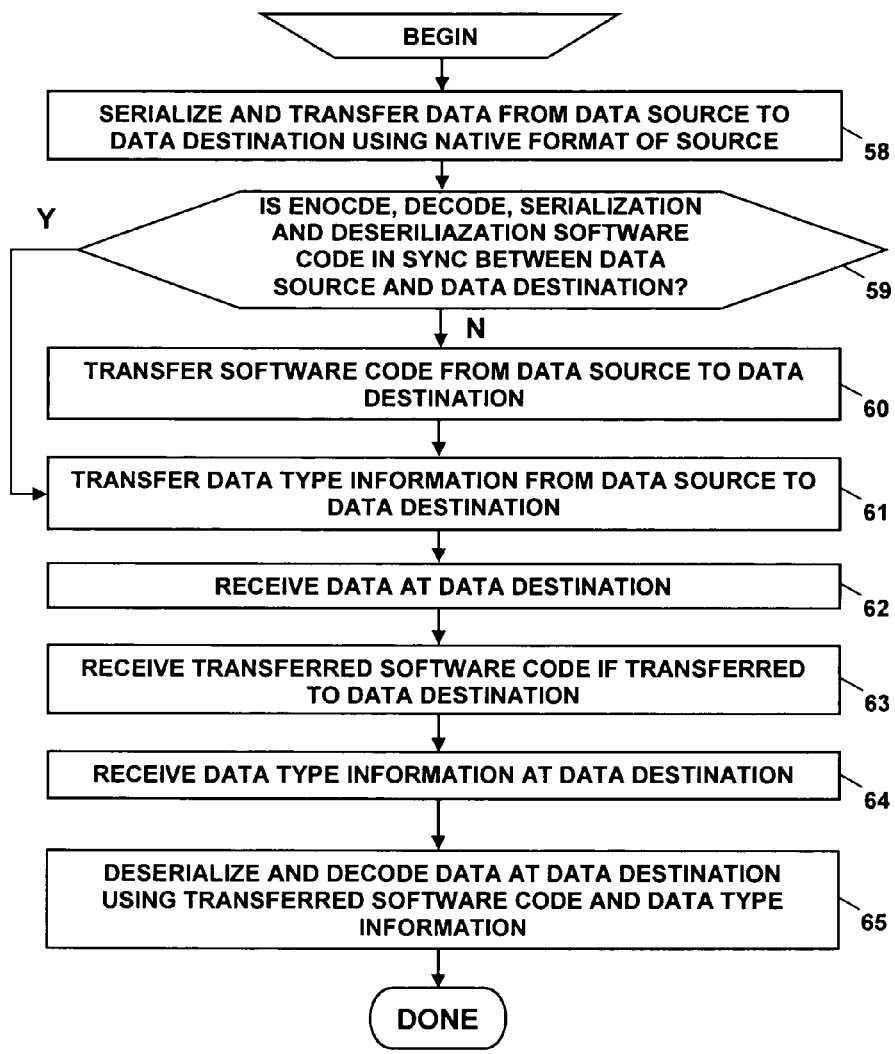
FIG. 4 shows a flow chart of method used to transfer binary data from data source to data destination using native format of source.

FIG. 4 shows a flow chart of a method used to transfer binary data from data source 31 to data destination 44 using native format of data source 31. This method involves using serialization, deserialization, encoding, and decoding software modules In step 58, data is serialized at data source 31 by data serialization software module at source 37 and transferred to data destination 32 by data transfer software module at data source 34.

In step 59, a check is performed by code check module at data destination 46 to verify if transferred code software code 47 that includes encode, decode, serialization and deserialization software, is in sync with data source 31.

In step 60, if check in step 59 indicates that transferred code software code 47 at data destination 32 is out of sync with data source 31, then a new version of transferred code software code 47 is sent from data source 31 to data destination 32.

In step 61, data type information is transferred to data destination 32 by software code and data type information upload software module 35 at data source 31.

In step 62, binary data is received at data destination 32.

In step 63, transferred code software code 47 is received at data destination 32.

In step 64, data type information is received at data destination 32.

In step 65, binary data is decoded and deserialized using transferred code software code 47 and transferred data type information 52.

Figure 5:
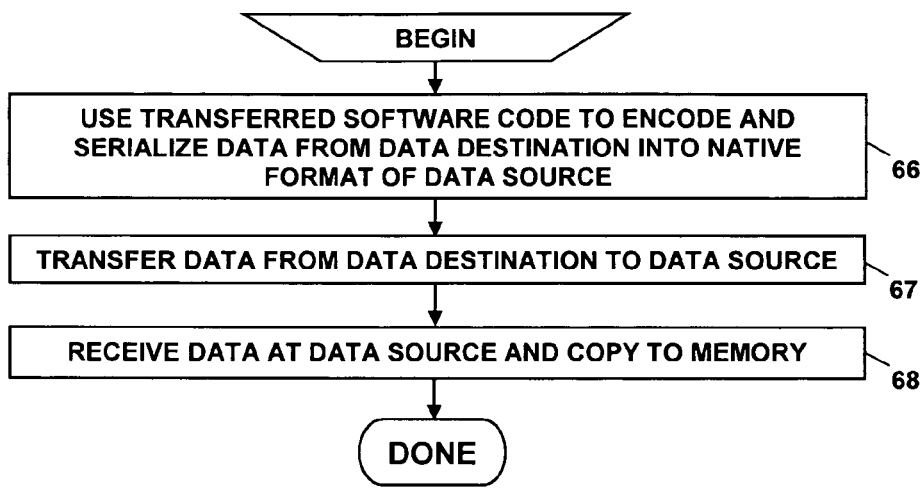
FIG. 5 shows a flow chart of method used to binary transfer data from data destination to data source using native format of data source.

FIG. 5 shows a flow chart of a method used to transfer binary data from data destination 44 to data source 31 using native format of data source 31.

In step 66, transferred code software code 47 is used to encode and serialize data from data destination 32 into native format of data source 31.

In step 67, encoded and serialized data is transferred from data destination 32 to data source 31.

In step 68, encoded and serialized data sent from data destination 32 is received by data source 31 and copied to memory.

ADVANTAGES

From the description above a number of advantages of this binary data serialization system become evident:
a) a data serialization system is provided that completely eliminates data parsing, encoding and decoding of data at a server in a client server data communication system;
b) a data serialization system is provided that does not mandate a intermediate format that is common across client and servers;
c) a data serialization is provided system that uses the servers native data format as the transfer format to and from the server, thus eliminating any data conversions at the server;
d) a data serialization is provided system that reduces computational resource at client for decoding and encoding data that is to be communicated to the server, although not eliminating such overheads completely; and
e) a data serialization system is provided that enables client software to be upgraded automatically for decoding and encoding data to be communicated with server if there is a change in data formats in server.

CONCLUSION, RAMIFICATIONS AND SCOPE

Accordingly, the reader will see that by combining a native data format of a server along with software code transfer to decode and encode such data at the client, provides an unobvious result of reducing processing overheads at both server and client. None of the prior art systems completely eliminate processing overheads at either the client or server. The system of present invention enables eliminating encoding decoding processing overheads completely at the server and reduces processing overheads at the client.

Although the description above contains many specificities, these should not be construed as limiting the scope of invention but merely as providing illustrations of some of the presently preferred embodiments of this invention. Thus the scope of this invention should be determined by appended claims and their legal equivalents, rather than by example given.

We claim:

1. A system to transfer binary data from a data source processing device to a data destination processing device comprising:
   a data source software module capable of storing data in memory of said data source processing device;
   a data transfer software module associated with said data source software module to transfer said binary data from said memory in native data format of said data source software module into a network stream;
   a software code and data type information upload software module associated with said data source software module that enables transfer of software code and data type information from said data source to said data destination, wherein said software code enables encoding and decoding of said binary data at said data destination in said native format of said data source, and said data type information is comprised of data offset information, endian information, and data size information of each data type in said binary data; and
   said data destination software module associated with said data destination processing device capable of executing said software code to decode and encode said data in said native binary format of said data source software module using said data type information;
   wherein
   said data source processing device executes said software modules associated with said data source processing device using hardware instruction processors selected from group consisting of a general purpose processor, and a graphics processor; and
   said data destination processing device executes said software modules associated with said data destination processing device using hardware instruction processors selected from group consisting of a general purpose processor, and a graphics processor.

2. The system to transfer binary data of claim 1, further comprising:
   a data serialization software module associated with said data source to serialize binary data from said memory at said data source software module that enables serialization of binary data to form a sequence of bytes from a tree of related memory data structures at said data source software module; and
   a data deserialization software module transferred in said software code from said data source to said data destination to deserialize said data from said data source software module;
   a data serialization software module transferred in said software code from said data source to said data destination to serialize data from said data destination software module into said binary data format of said data source; and
   a data deserialization module associated with said data source software module to deserialize said data from said data destination software module.

3. The system to transfer binary data of claim 2, further comprising:
   a data encode software module associated with said data source software module to encode said binary data to base sixty four format so that said binary data can pass through a textual protocol channel such as hyper text transfer protocol;
a data decode software module associated with said data source software module to decode said binary data in said base sixty four data format;
a data encode software module associated with said data destination software module to encode said binary data to base sixty four format so that said binary data can pass through a textual protocol channel such as hyper text transfer protocol; and
a data decode software module associated with said data destination software module to decode said binary data in said base sixty four data format.

4. The system to transfer binary data of claim 1, wherein:
said data source software module is a data server such as a web server, and said data destination software module is a data client such as a web browser in a client server system.

5. The system to transfer binary data of claim 1, wherein:
said software code is executed at said data destination software module with a software execution environment selected from group consisting of interpreter execution environment, and native code execution environment.

6. The system to transfer binary data of claim 1, further comprising:
data transfer software module associated with said data destination software module to create reverse flow data by encoding data from native data format of said data destination software module to said native data format of data source software module using said software executed in said data execution environment.

7. The system to transfer binary data of claim 1, further comprising:
a code check software module at said data destination software module to check if said software code transferred to said data destination software module is out of sync with said native data format at said data source software module; and
a code transfer module at said data source software module to enable transfer of said software code if said check by said code check module returns true.

8. A method to transfer binary data from a data source to a data destination comprising:
transferring data from said data source to said data destination using a network stream in native data format of said data source;
transferring encoding decoding software code from said data source to said data destination using said network stream whenever said data destination is out of sync with said data source, wherein said software code comprises of software code to encode and decode said binary data in said native data format of said data source;
transferring data type information from said data source to said data destination wherein said data type information is comprised of data offset information, endian information, and data size information of each data type in said data;
receiving said data from said data source at said data destination;
receiving said software code from said data source at said data destination;
receiving said data type information from said data source at said data destination; and
using said software code and said data type information to decode said binary data and create data in native data format of said data destination.

9. The method to transfer binary data of claim 8, further comprising:
serializing said data at said data source before transferring to said network stream;
and deserializing said data at said data destination after receiving from said network stream.

10. The method to transfer binary data of claim 9, further comprising:
encoding said data to base sixty four format at said data source before transferring to said network stream so that said binary data can pass through a textual protocol channel such as hyper text transfer protocol; and
decoding said data from said base sixty four format at said data destination.

11. The method to transfer binary data of claim 8, wherein:
said data source is a data server such as a web server, and said data destination is a data client such as a web browser in a client server system.

12. The method to transfer binary data of claim 8, wherein:
said software is executed at said data destination with a software execution environment selected from group consisting of interpreter execution environment, and native code execution environment.

13. The method to transfer binary data of claim 8, further comprising:
encoding data further referred to as reverse flow data, at said data destination from said native data format of said data destination to said native data format of said data source for reverse transfer of data from said data destination to said data source using said software;
transferring said reverse flow data into said network stream;
receiving said reverse flow data at said data source from said network stream; and
copying said reverse flow data from said network stream into memory of said data source without any decoding, as said reverse flow data is in native data format of said data source.

14. The method to transfer binary data of claim 13, further comprising:
serializing said reverse flow data at said data destination before transferring to said network stream; and
and deserializing said reverse flow data at said data source received from said data destination.

15. The method to transfer binary data of claim 14, further comprising:
encoding said data to base sixty four format at said data destination before transferring to said network stream so that said binary data can pass through a textual protocol channel such as hyper text transfer protocol; and
decoding said data from said base sixty four format at said data source.

16. The method to transfer binary data of claim 8, further comprising:
checking at said data destination if said software code transferred is out of sync with said native data format at said data source; and
transferring an updated version of said software code from said data source to said data destination if said check returns true.

* * * * *